(12) United States Patent
Kang

(10) Patent No.: US 7,302,623 B2
(45) Date of Patent: Nov. 27, 2007

(54) ALGORITHM PATTERN GENERATOR FOR TESTING A MEMORY DEVICE AND MEMORY TESTER USING THE SAME

(75) Inventor: Jong Koo Kang, Suwon (KR)

(73) Assignee: Unitest, Inc., Yongin-si, Kyunggi-do (KR)

( * ) Notice: Subject to any disclaimer, the term of this patent is extended or adjusted under 35 U.S.C. 154(b) by 248 days.

(21) Appl. No.: 11/193,372

(22) Filed: Aug. 1, 2005

(65) Prior Publication Data
US 2006/0031725 A1 Feb. 9, 2006

(30) Foreign Application Priority Data
Aug. 3, 2004 (KR) ............. 10-2004-0061085

(51) Int. Cl.
*G11C 29/00* (2006.01)
*G01R 31/28* (2006.01)

(52) U.S. Cl. .................. 714/718; 714/738

(58) Field of Classification Search .......... 714/728, 714/718
See application file for complete search history.

(56) References Cited

U.S. PATENT DOCUMENTS

| | | | |
|---|---|---|---|
| 6,650,583 B2 | 11/2003 | Haraguchi et al. | |
| 6,658,612 B1 | 12/2003 | Park et al. | |
| 6,754,868 B2 | 6/2004 | Bristow et al. | |
| 6,784,686 B2 * | 8/2004 | Nishida et al. | 324/765 |
| 6,993,696 B1 * | 1/2006 | Tanizaki et al. | 714/744 |
| 7,003,697 B2 * | 2/2006 | Magliocco | 714/25 |
| 7,032,141 B2 * | 4/2006 | Tanizaki | 714/718 |

* cited by examiner

*Primary Examiner*—James C. Kerveros
(74) *Attorney, Agent, or Firm*—Sughrue Mion, PLLC

(57) ABSTRACT

Disclosed is an algorithm pattern generator for testing a memory device. It has a configuration which can optimize a configuration of a memory tester including an address scrambling and a data scrambling in the memory tester for carrying out a test at a memory device module level or a component level.

17 Claims, 10 Drawing Sheets

Fig. 1 <Related Art>
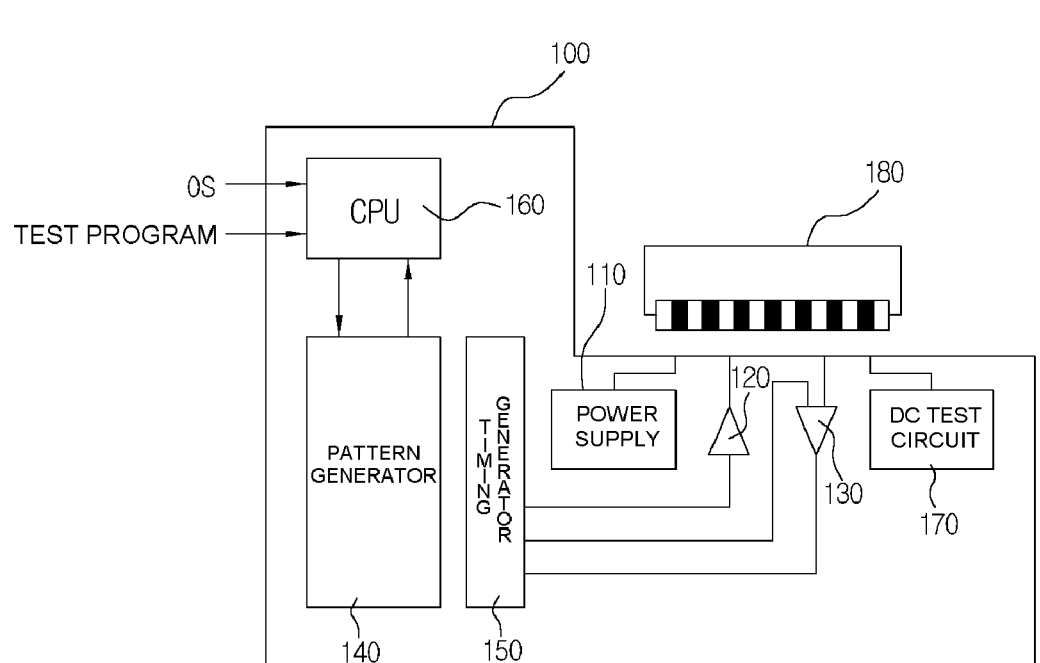
Fig. 2 <Related Art>
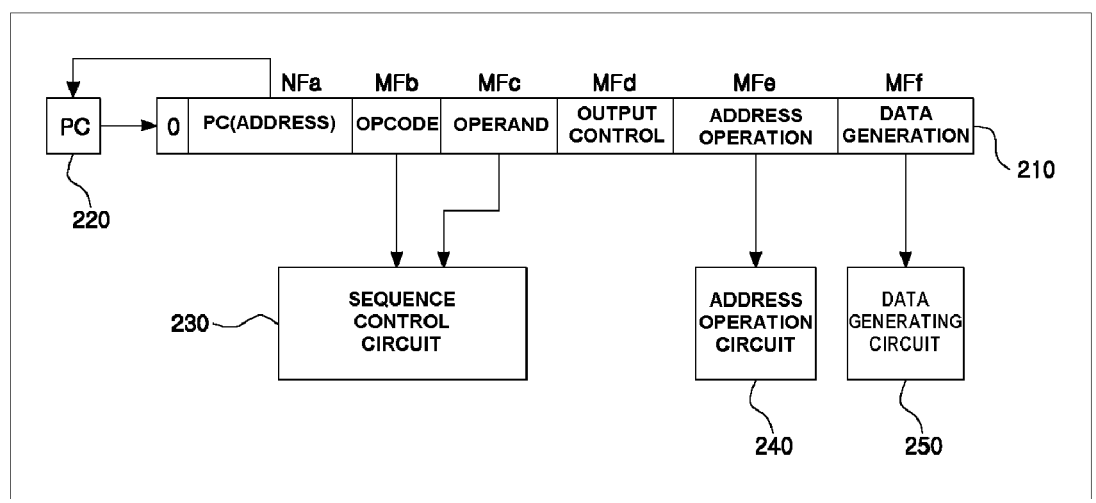

Fig. 10b

```
;****************************************************
;*** pymarch_6n_bl4cl25.ttl
;*** Y-march 6N pattern
;*** MRS : CL2.5, BL4
;*** Written by Jongkoo
;*** 2004-07-27
#INCLUDE "..\lib\define.ttl"
#INCLUDE "..\lib\power&cbr.ttl"
#INCLUDE "..\lib\yfast_ddr333.ttl"

REGISTER
    CX1=0x1FFF      ; X count
    CX2=0xFF        ; Y count
    CX3=0x3         ; Z count(Bank Address)
    XR=0            ; DX initial
    YR=0            ; DY initial
    ZR=0            ; Z initial
    DR=0x0FF0       ; D initial [DRH:DRL]
    DCMR=0x0000     ; Data complement mask register [DCMRH:DCMRL]
    MRSR=0x62       ; MRS Register (CL=2.5, BL=4)
    TIMER=7.8us     ; Refresh Timer (0.1us ~ 10s)
    ISR=CBR1C       ; Refresh Function
ENDREGISTER START
    | CALL  PWRUP0        ; call power up sequence function
    | NOP   X=0x62
    | NOP   MRS  ASCROFF  ; mrs(CL=2.5, BL=4)
    | NOP
    | CALL  WT_D_BL4
    | CALL  RD_D_WT_DB_BL4
    | CALL  RD_DB_WT_D_BL4
    | CALL  RD_D_BL4
END
```

```
;****************************************************
;*** define.ttl
;*** Sub-Function Library (Macro definition)
;*** Written by Jongkoo
;*** 2004-07-27
;****************************************************
;DEFINE MACROS
    #DEFINE  INIT    Z=0 X=0 Y=0 DX=0 DY=0 D=DR
    #DEFINE  MRS     CS  RAS CAS WE
    #DEFINE  AREF    CS  RAS CAS
    #DEFINE  ACT     CS  RAS
    #DEFINE  WT      CS      CAS WE        AY
    #DEFINE  RD      CS      CAS           AY
    #DEFINE  WTAP    CS      CAS WE  AP AY
    #DEFINE  RDAP    CS      CAS     AP AY
    #DEFINE  PRE     CS  RAS     WE        AY
    #DEFINE  PALL    CS  RAS     WE  AP AY
    #DEFINE  BST     CS          WE
    #DEFINE  MASK    DMH DML
    #DEFINE  CPE     CPEH CPEL
```

```
;****************************************************
;*** power&cbr.ttl
;*** Sub-Function Library (Powerup & Refresh)
;*** Written by Jongkoo
;*** 2004-07-27
;****************************************************
;Power up sequence function with Data Mask
FUNCTION PWRUP0
    | PAUSE   200us                       ; Wait 200us
    | NOP     MASK  INIT
    | NOP     MASK  PALL       all        ; bank precharge
    | NOP     MASK
    | NOP     MASK  Z=1  X=0x0
    | NOP     MASK  MRS        ASCROFF    ; emrs(DLL=ON)
    | NOP     MASK
    | NOP     MASK  Z=0  X=0x100
    | NOP     MASK  MRS        ASCROFF    ; mrs(DLL=RESET)
    | NOP     MASK
    | NOP     MASK
    | NOP     MASK  PALL       all        ; bank precharge
    | NOP     MASK
    | NOP     MASK
    | NOP     MASK  AREF                  ; auto refresh
    | NOP     MASK
    | NOP     MASK
    | NOP     MASK
    | NOP     MASK
```

```
    | NOP     MASK
    | NOP     MASK
    | NOP     MASK
    | NOP     MASK
    | NOP     MASK
    | NOP     MASK
    | NOP     MASK
    | NOP     MASK  AREF                  ; auto refresh
    | PAUSE   1us ;                       Wait 1us
    | RET
ENDFUNCTION ;Refresh 1 Cycle
FUNCTION CBR1C
    | NOP                ; meet tRP=3
    | NOP
    | NOP     AREF       ; auto refresh
    | NOP                ; meet tRFC=12
    | NOP
    | NOP
    | NOP
    | NOP
    | NOP
    | NOP
    | NOP
    | NOP
    | NOP
    | NOP
    | RET
ENDFUNCTION ;****************************************************
; Sub-Function Library (YFAST_DDR333.TTL)
; Addressing        : YFAST March
; Direction         : Forward & Backward
; Burst Length      : BL1, BL2, BL4, BL8
; AC Timing Target  : DDR333
;     (tRCD=3clk, tRP=3clk, tWR=2clk, tRAS=7clk, tRC=10clk)
; Written by Jongkoo, Kang @ 2004-07-27
;****************************************************
FUNCTION WT_D_BL4
        | NOP
        | NOP    INIT
LP01:   | NOP    ACT
        | NOP
        | NOP
        | NOP    WT    D
        | NOP          D
        | NOP
        | NOP
        | NOP    PRE
        | NOP
        JNZ2    LP01   Y=Y+4
        JNZ1    LP01   X=X+1 Y=0
        JNZ3    LP01   Z=Z+1 Y=0 X=0
        NOP            Z=0
    RET
ENDFUNCTION FUNCTION RD_D_WT_DB_BL4
        | NOP
        | NOP    INIT
LP01:   | NOP    ACT
        | NOP
        | NOP
        | NOP    RD    D     CPE
        | NOP          D     CPE
        | NOP
        | NOP
        | NOP    PRE
        | NOP
        | NOP
        | NOP    ACT
        | NOP
        | NOP
        | NOP    WT    /D
        | NOP          /D
        | NOP
        | NOP
        | NOP    PRE
        | NOP
        JNZ2    LP01   Y=Y+4
        JNZ1    LP01   X=X+1 Y=0
        JNZ3    LP01   Z=Z+1 Y=0 X=0
        NOP            Z=0
    RET
ENDFUNCTION
FUNCTION RD_DB_WT_D_BL4
```

ALGORITHM PATTERN GENERATOR FOR TESTING A MEMORY DEVICE AND MEMORY TESTER USING THE SAME

RELATED APPLICATIONS

The present disclosure relates to subject matter contained in priority Korean Application No. 10-2004-0061085, filed on 3 Aug. 2004, which is herein expressly incorporated by reference in its entirety.

BACKGROUND OF THE INVENTION

1. Field of the Invention

The present invention relates to an algorithm pattern generator for testing a memory device, and more particularly to an algorithm pattern generator for testing a memory device having a configuration which can optimize a configuration of a memory tester including an address scrambling and a data scrambling in a memory tester for carrying out a test at a memory device module level or a component level.

2. Description of the Related Art

An algorithm pattern generator (hereinafter referred to as "ALPG") is a device for generating a pattern in a memory tester used for testing a semiconductor device, especially a memory module or a memory component. The ALPG is used for coding an instruction in order to test data reading/writing operations.

A semiconductor tester, particularly a memory tester is designed and developed depending on development status of a memory device, especially that of a DRAM which takes a significant portion of the memory device. The development status of DRAM has evolved from a DRAM having an EDO (Extended Data Output) function, through SDRAM (Synchronous DRAM) and Rambus DRAM to DDR (Double Data Rate) DRAM.

In order to test these DRAMs, high speed and high accuracy are required for the memory testers. Moreover, as the capacity of the DRAM is increased, time necessary for the test is increased. Therefore, a test speed must be increased. A small and economical memory tester must be embodied in order to reduce the test cost.

FIG. 1 is a block diagram exemplifying a conventional tester.

Referring to FIG. 1, a memory tester 100 comprises a power supply 110 for supplying power voltage to a memory device 180 to be tested including a memory module or a memory component, a driver 120 for inputting a signal to an input unit of the memory device 180, a comparator 130 for comparing a signal output from an output unit of the memory device 180 with an expected value, a pattern generator 140 for generating a signal array (test pattern) which is input to the memory device 180 and an expected value signal, a timing generator 150 for generating timing for a signal which is input to the memory device 180, a CPU 160 which is a controller for controlling these circuits. The CPU 160 is configured to read from an external storage device and interpret the read data by an operating system (OS), thereby performing a generation and a determination of a signal for the test (test pattern) and carrying out predetermined tests. The tester 100 may comprise a DC test circuit 170 for carrying out a DC test such as detection of a voltage level of the output unit.

Since the above-described conventional memory tester performs a DC test for testing whether DC parameters are suitable for digital circuit operations and an AC margin test related to signal transmission delay time, set-up time and hold time, and comprises various components such as the timing generator, an expensive dedicated equipment having a large size such as a main frame is required to manufacture the conventional memory tester. Therefore, the conventional memory tester is disadvantageous in that the manufacturing cost is very high. It is preferable for memory manufacturers to minimize the production cost and to design an efficient memory tester so as to remain competitive in the market. Therefore, the memory tester must be efficiently designed to maintain a small size and reduce the production cost.

In order to achieve miniaturization of the tester, a technology for optimizing ALPG which is related to a generation of test patterns have been proposed.

For example, such an ALPG is disclosed in Korean Patent Application No. 2001-0045014 file by Hitachi Ltd. On Jul. 26, 2001, titled "A METHOD FOR GENERATING TESTER CONSTRUCTION DATA, CONSTRUCTION METHOD FOR TESTER AND TEST CIRCUIT".

FIG. 2 is a block diagram illustrating an algorithm pattern generator disclosed by the Korean Patent Application No. 2001-0045014.

Referring to FIG. 2, the conventional ALPG comprises an instruction memory 210 for storing a micro program consisting of a plurality of micro instructions configured according to a test pattern generating algorithm, a program counter 220 for designating which is to be read from the instruction memory 210, a sequence control circuit 230 for generating a control signal for a memory circuit by decoding a instruction code in the micro instruction read out from the instruction memory 210 or a function block that constitutes ALPG such as the program counter 220, an address operation circuit 240 for generating a test address according to the micro instruction read out from the instruction memory 210, and a test data generating circuit 250 for generating a test data and a expected value data according to the read micro instruction.

Moreover, when determining whether the memory circuit under test is normal or not, means for determining whether the data read out from the memory circuit is consistent with the written data by comparing the same may be included. In addition, as shown in FIG. 2, the micro instruction stored in the instruction memory 210 includes an address field MPa for storing a PC (Program Counter) address denoting a jump address of a instruction used as a jump instruction, an OPcode field MFb for storing a sequence control code, an operand field MFc for storing the number of repeated instruction, a control field MFd for storing a control code for commanding an output and read/write operation of an address or a data, an address operation code field MFe for storing an address operation instruction code, and a data generation code field MFf for storing data generation instruction code.

However, the Korean Patent Application No. 2001-0045014 does not disclose an address scrambling or a data scrambling at all. The address scrambling refers to a mutual conversion for matching a physical address and a logical address (represented as row and column) of the memory. The data scrambling is represented as a function of an address. Since methods for minimizing an area of a layout differs depending on memory manufacturers, the scrambling of data is a process for conformity. In order to efficiently design the ALPG and optimize the configuration of the memory tester, the design of ALPG must take the scrambling into consideration.

SUMMARY OF THE INVENTION

It is an object of the present invention to provide an algorithm pattern generator for testing a memory device having a configuration which can optimize a configuration of a memory tester including an address scrambling and a data scrambling.

It is another object of the present invention to provide a memory tester using the algorithm pattern generator.

It is yet another object of the present invention to provide a test method for the memory device using the algorithm pattern generator for testing the memory device.

It is also an object of the present invention to provide a computer-readable recording medium having embodied thereon a program for the algorithm pattern generator for testing the memory device.

In order to achieve the above-described objects of the present invention, there is provided an algorithm pattern generator for testing a memory device, comprising: an instruction memory for receiving from an external console PC and storing a test program including an instruction for performing a test; a sequence control unit for sequentially fetching the instruction included in the test program from the instruction memory when performing the test; an interface unit for interfacing to an external device; a PLL for providing a clock signal having an identical phase; a command generating unit for generating a command necessary for the test with respect to each of cycles provided by the PLL; an address generating unit for generating a logical address with respect to each of the cycles and converting the logical address to a physical address necessary for the test via an address scrambling; an data generating unit for generating a logical data based on the logical address with respect to each of the cycles and converting the logical data to a physical data necessary for the test via an data scrambling; and a data comparing unit for comparing a data generated in the data generating unit and a test data for each of the cycles and storing an information on a failed memory.

There is also provided a memory tester for testing a memory device, comprising: a variable power supply for providing a voltage for a test of the memory device; a console PC for generating the test program and receiving and analyzing a test result; a clock generating unit for generating a reference clock and a control unit for controlling; and a pattern generating board for receiving the test program from the console PC to generate a test pattern signal, transmitting the test pattern signal to the memory device to be tested and receiving and comparing a test result output from the memory device, wherein a test pattern is generated and a test is performed using the above algorithm pattern generator.

There is also provided a method for testing a memory device using an algorithm pattern generator, comprising the steps of: generating a test program by loading and compiling a source program including an information on a test with a compiler; transmitting the test program to the algorithm pattern generator in accordance with one of claims 1 through 15 to store the same in a internal instruction memory; fetching an instruction stored in the test program and generating a test pattern including a command logic, a address logic and a data logic to be applied to a memory device to be tested, whereby performing a test; determining a failed memory device after performing the test by comparing a data output from the memory device with a value generated from the algorithm pattern generator in accordance with one of claims 1 through 15; and storing an information on the failed memory when the failed memory is determined.

There is also provided a computer-readable recording medium having embodied thereon a program performing the functions of: receiving from a external console PC and storing a test program including an instruction for performing a test; sequentially fetching the instruction of the test program from an instruction memory when performing the test; performing an interfacing with an external device; generating and providing a clock signal having an identical phase; and in accordance with a clock cycle of the clock signal, generating a logical address with respect to each of the clock cycle and converting the logical address to a physical address necessary for the test via an address scrambling; generating a logical data based on the logical address with respect to each of the cycles and converting the logical data to a physical data necessary for the test via an data scrambling; and comparing a data generated by the data generating unit with a test data in accordance with each of the clock cycles and storing information on a failed memory.

BRIEF DESCRIPTION OF THE DRAWINGS

FIG. 1 is a block diagram exemplifying a conventional tester.

FIG. 2 is a block diagram illustrating a conventional algorithm pattern generator.

FIG. 10*b* is diagram illustrating an example of a source program in the test method using the algorithm pattern generator for testing memory device in accordance with the present invention.

DETAILED DESCRIPTION OF THE INVENTION

The present invention will now be described in detail with reference to the accompanied drawings.

Figure 3:
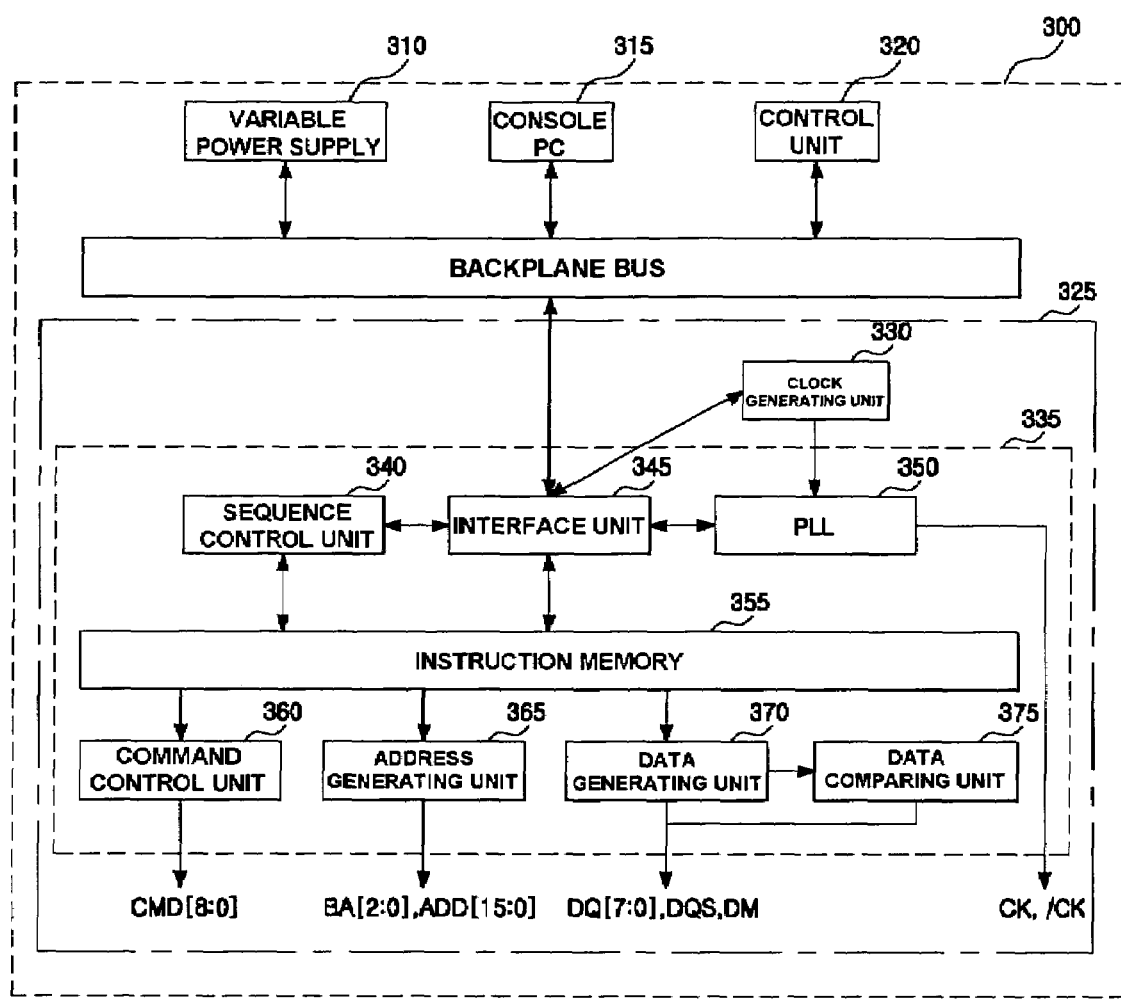
FIG. 3 is a block diagram illustrating a memory tester including an algorithm pattern generator for testing memory device in accordance with the present invention.

FIG. 3 is a block diagram illustrating a memory tester including an algorithm pattern generator for testing memory device in accordance with the present invention.

Referring to FIG. 3, a memory tester 300 in accordance with the present invention comprises a variable power supply 310, a console PC 315, a control unit 320 and a pattern generating board 325. The pattern generating board 325 comprises a clock generating unit 330 and an ALPG 335. The ALPG 335 comprises a sequence control unit 340, an interface unit 345, a PLL (Phase Lock Loop) 350, an instruction memory 355, a command generating unit 360, an address generating unit 365, a data generating unit 370 and a data comparing unit 375. Preferably, the ALPG 335 is embodied as a single chip using FPGA.

The variable power supply 310 supplies various powers necessary for a test of a memory device. The variable power supply 310 also supplies power to a Device Under Test (hereinafter referred to as "DUT").

The console PC 315 is connected to the pattern generating board 325 through a backplane bus. The console PC 315 provides a function such as transmitting a test program to the pattern generating board 325 and also receives and analyzes a test result.

The control unit 320 provides a control for the memory tester 300.

Although not shown, a slot for installing a DUT, for example a DIMM slot, or a DUT board including component socket may be included.

The pattern generating board 325 receives the test program from the console PC 315 and generates a test pattern signal through the ALPG 335. The test pattern signal is then transmitted to DUT and a test result is received and compared by the pattern generating board 325. The result of a comparison (or the test result) may be transmitted to the console PC 315 and then be analyzed.

The clock generating unit 330 generates a reference clock and supplies the same to the interface unit 345 and the PLL 350 in the ALPG 335.

The sequence control unit 340 sequentially fetches a test program instruction from the instruction memory 355 during a test.

The interface unit 345 interfaces the ALPG 335 with the variable power supply 310, the console PC 315 and the control unit 320 through the backplane bus. The interface unit 345 also receives a clock and supplies the same to the PLL 350. In addition, the interface unit 345 transmits the test result to the console PC 315.

The PLL 350 renders a phase difference between a clock signal received from the interface unit 345 and a clock signal received from the clock generating unit 330 to zero so as to generate a clock signal having an identical phase. Outputs CK and /CK of the PLL 350 refers to a clock and an inverted clock.

The instruction memory 355 receives the test program from the console PC 315 through the interface unit 345 and stores the same.

The command generating unit 360 generates a command logic necessary for the test for each clock cycle. An output signal CMD[8:0] of the command generating unit 360 refers to, for example, a command including CS (chip select), RAS (Row Address Strobe) and CAS (Column Address Strobe) signals which is an internal command signal of a DDR SDRAM.

The address generating unit 365 generates an address logic necessary for the test through an address scrambling for each clock cycle. An output signal BA[2:0] of the address generating unit 365 refers to a bank address, ADD [15:0] to a physical address.

The data generating unit 370 generates a data logic necessary for the test through a data scrambling for each clock cycle. An output signal DQ[7:0] of the data generating unit 370 refers to a data bus which performs a data input/output, DQS to data strobe and DM to an internally loaded signal for conforming the DQ and DQS.

The data comparing unit compares a data generated in the data generating unit 370 with a test data for each clock cycle.

Figure 4:
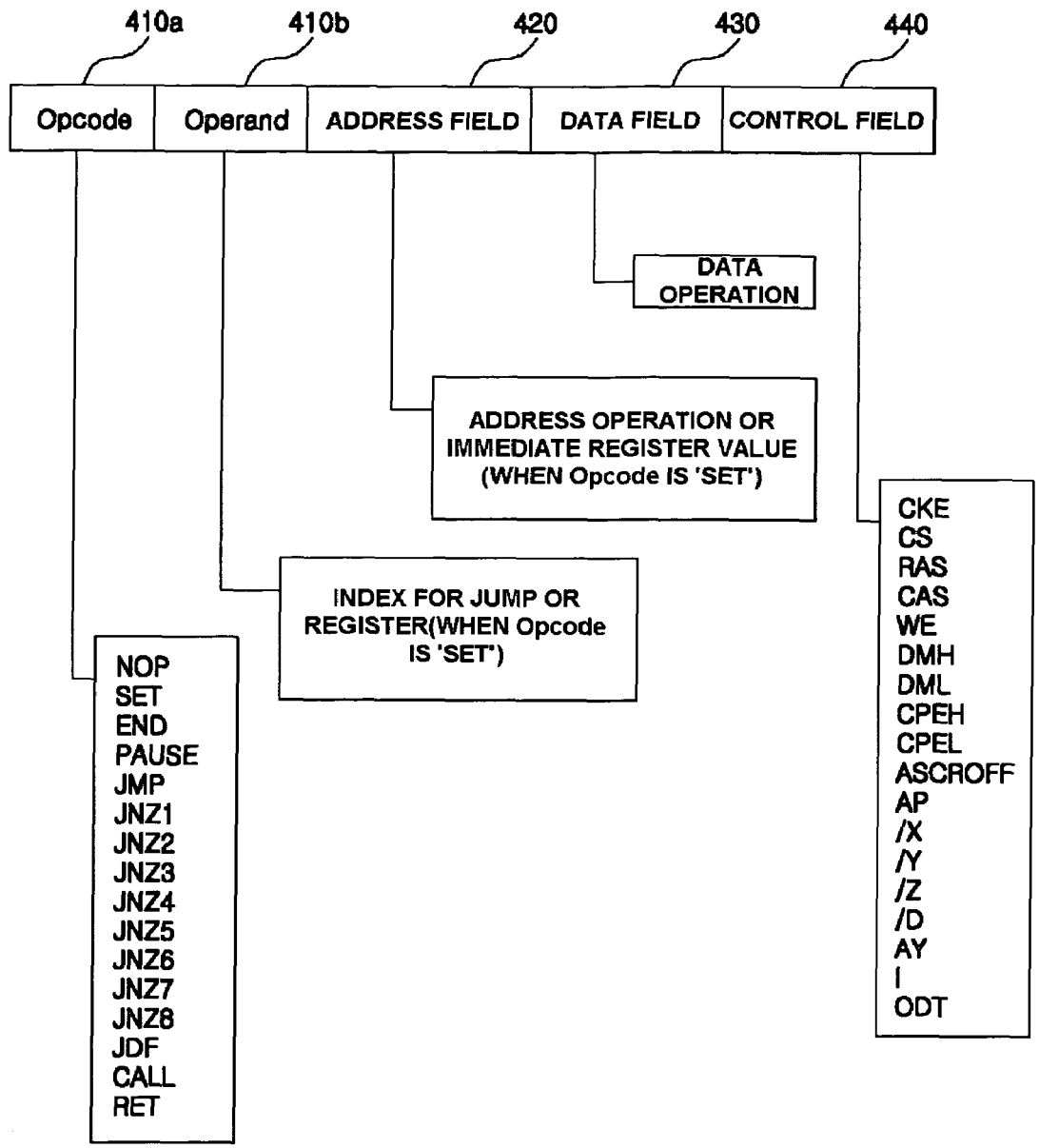
FIG. 4 is diagram illustrating an example configuration of an instruction of the algorithm pattern generator for testing memory device in accordance with the present invention.

FIG. 4 is diagram illustrating an example configuration of an instruction of the algorithm pattern generator for testing memory device in accordance with the present invention.

Referring to FIG. 4, the instruction stored in the instruction memory 355 comprises sequence fields 410a and 410b, an address field 420, a data field 430 and a control field 440.

The sequence fields 410a and 410b may be classified as an opcode 410a and an operand 420b, and used for calculating an instruction point and controlling a sequence of the test program for each clock cycle.

The opcode 410a refers to an operation code including NOP (no operation), SET (opcode for setting a register), END (end of pattern), PAUSE (stop sequence), JMP (unconditional jump), JNZ1 through JNZ8 (conditional jumps when corresponding registers CX1 through CX8 are not zero), CALL (subroutine call), and RET (return from subroutine).

The operand 420b refers to an index for a jump or a register when opcode=SET.

The address field 420 is field for arithmetic operation for generating a memory address line.

An ALU-X refers to an address operation of a row address X of a memory, an ALU-Y refers to an address operation of a column address Y of the memory, an ALU-Z refers to an address operation of a bank address Z of the memory, ALU-DX and ALU-DY refer to address operations of addresses DX and DY which are additional addresses to the X and Y addresses.

For example, codes for performing address operations such as X=X, X=/X, X=X*2, X=DX, X=X+DX, X=X−DX, X=X&DX, X=X|DX, X=immX (immediate value of the X address), X=X+immX, X=X−immX, X=X&immX, X=X|immX and X=X^immX are included for the ALU-X. The ALU-Y is similar to the ALU-X.

The immediate values such as immX and immY is for constructing a command set so that random values may be assigned to a X and a Y registers in the microcode.

Codes for performing address operations such as Z=Z, Z=0, Z=/Z, Z=Z+1, Z=Z−1, Z=Z*2, Z=Z/2, Z=ZR, Z=1, Z=2 and Z=3 are included for the ALU-Z.

Codes for performing address operations such as DX=DX, DX=0, DX=/DX, DX=DX+1, DX=DX−1, DX=DX*2, DX=DX/2 and DX=XR are included for the ALU-DX. The ALU-DY is similar to the ALU-DX.

The ALU-X, the ALU-Y, the ALU-DX and the ALU-DY will be described in detail later with a description of the address generating unit 365.

The data field 430 is a field for arithmetic operation for generating a memory data line.

An ALU-D register may be updated by an operation with an initial register or an operation with an immediate value. A DP field, which is a portion of the data field 430, is a simplified representation of a data generation according to a present X-Y address state. The ALU-D register and the DP field are finally subjected to an exclusive OR operation.

Codes for performing address operations such as D=D, D=/D, D=D*2, D=D/2, D=DR, D=immD, D=D+immD, D=D−immD, D=D&immD, D=D|immD and D=D^immD are included for the ALU-D.

The DP field may represent DPO (solid pattern), DP1 (checker board pattern), DP2 (row bar pattern), DP3 (column bar pattern), DP4 (diagonal pattern) and DP5 (mask parity).

The control field 440 is a filed that includes a memory control signal state and a real-time inversion flag, and so on.

The control field 440, for example, represents CKE(clock enable), CS(chip select), RAS(row address enable), CAS (column address enable), WE(write enable), ODT(on-die termination enable), DMH(data mask at high going edge), DML(data mask at low going edge), CPEH(compare enable at high going edge), CPEL(compare enable at low going edge), ASCROFF(address scramble disable), DSCROFF (data scramble disable), AP(auto precharge enable), /X(row address inversion flag), /Y(column address inversion flag), /Z(bank address inversion flag), /D(data inversion flag), AY(column address enable) and I(interrupt flag).

Figure 5:
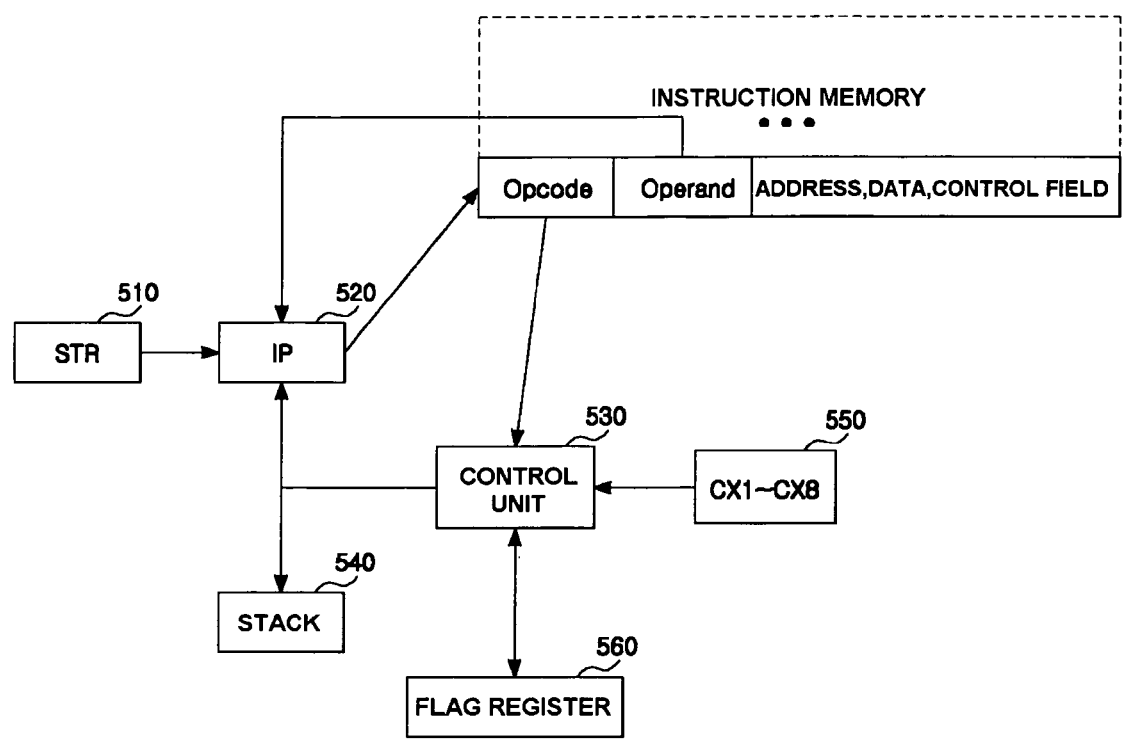
FIG. 5 is diagram illustrating an example configuration of a sequence control unit of the algorithm pattern generator for testing memory device in accordance with the present invention.

FIG. 5 is diagram illustrating an example configuration of a sequence control unit of the algorithm pattern generator for testing memory device in accordance with the present invention.

Referring to FIG. 5, the sequence control unit 340 comprises a start address register 510, an instruction pointer 520, a control unit 530, CX1 through CX8 550, a stack register 540 and a flag register 560.

The start address register ("STR") 510 is a register for storing a start address and for example is a 10 bit register.

The instruction pointer ("IP") 520 is a register for storing an instruction pointer and for example is a 10 bit register. The instruction pointer 520 loads and saves a corresponding pointer from an operand of the instruction memory the instruction memory 355.

The control unit 530 loads and controls a corresponding operation from opcode of the instruction memory 355, and performs controls of the IP 520, the stack register 540, and CX1 through CX8 550.

The stack register 540 is a register for a stack of the instruction pointer, and for example configured as a 16 bit/4 depth register.

CX1 through CX8 are registers for an instruction counter, and for example configured as a 16 bit register.

The flag register 560 stores a flag data.

Figure 6:
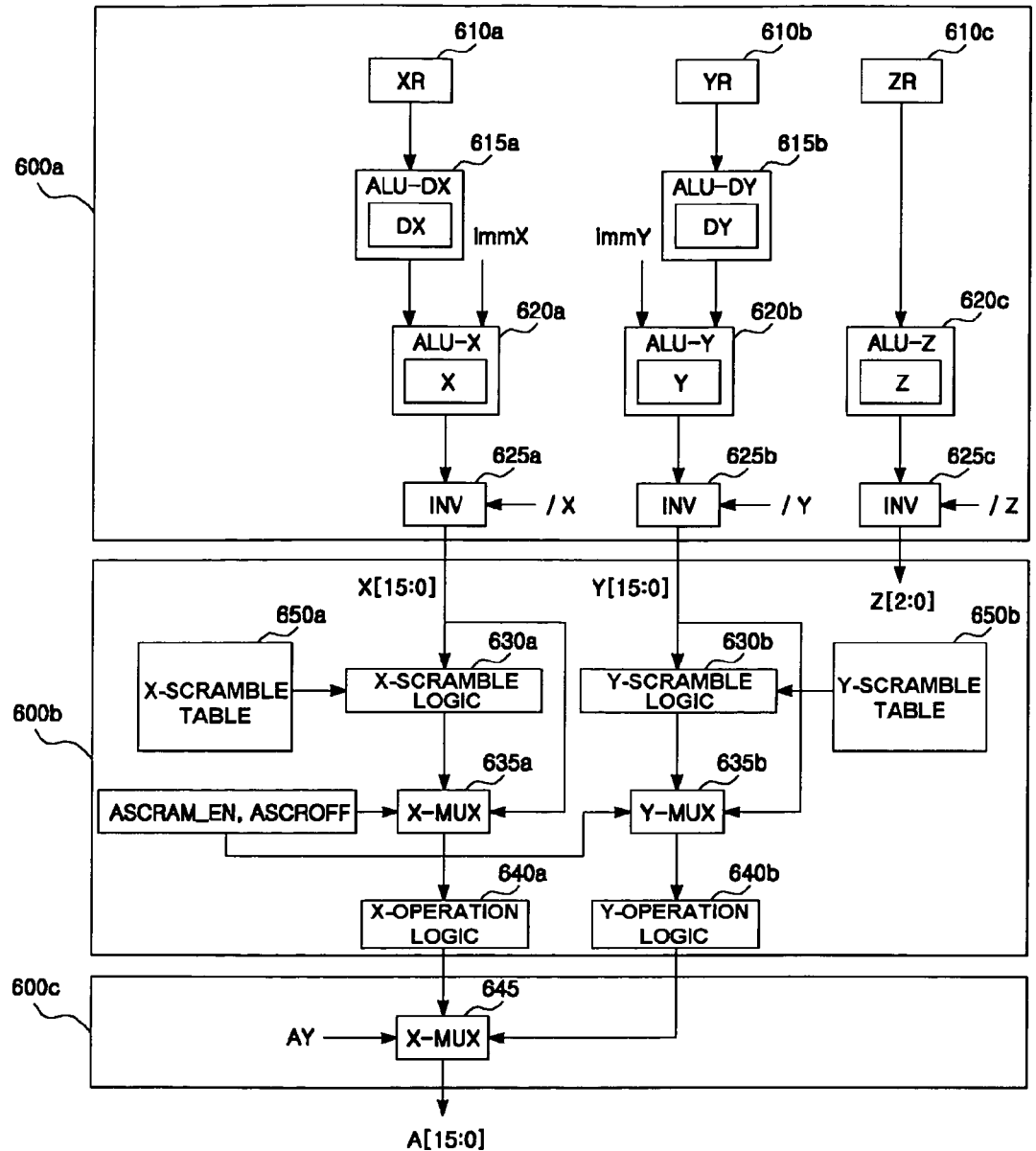
FIG. 6 is diagram illustrating an example configuration of an address generating unit of the algorithm pattern generator for testing memory device in accordance with the present invention.

FIG. 6 is diagram illustrating an example configuration of an address generating unit of the algorithm pattern generator for testing memory device in accordance with the present invention.

Referring to FIG. 6, the address generating unit 365 comprises a logical address generating unit the logical address generating unit 600a for generating the row address, the column address and the bank address of the memory, a scrambling address generating unit the scrambling address generating unit 600b for generating scrambled addresses of the row address and the column address, and an address multiplexing unit the address multiplexing unit 600c for multiplexing the scrambled addresses to generate a physical address.

The logical address generating unit 600a, the scrambling address generating unit 600b and the address multiplexing unit 600c will now be described in detail.

A description of the logical address generating unit 600a is as follows.

The initial register, i.e. the XR 610a, the YR 610b and the ZR 610c stores initial values of the row address X, the column address Y and the bank address.

The ALU-DX 615a and the ALU-DY 615b receives values of the initial registers XR 610a and YR 610b and performs an arithmetic operation to generate additional addresses DX and DY.

The ALU-X 620a and the ALU-Y 620b receives output values of the ALU-DX 615a and the ALU-DY 615b and immediate address values immX and immY and performs an arithmetic operation to generate the row and column addresses.

The ALU-Z 620c receives values of the initial registers ZR 610c and performs an arithmetic operation to generate the bank address.

INV 625a, 625b and 625c respectively performs inversion of data when inversion flags /X, /Y and /Z are input.

As a result, a row address X[15:0], a column address Y[15:0] and a bank address Z[2:0] are generated. The bank address Z[2:0] is identical to BA[2:0] shown in FIG. 3.

A description of the scrambling address generating unit 600b and the address multiplexing unit 600c is as follows.

An address scrambling refers to a mutual conversion for matching a physical address and a logical address (represented as row and column).

X[15:0] and Y[15:0] are received and then subjected to an address scrambling by an X-scramble logic 630a and Y-scramble logic 630b. In this case, the scrambling may be performed based on a reference data for scrambling stored in scramble tables 650a and 650b, respectively. The data stored in the scramble tables 650a and 650b is a unique data for generating memory address data depending on each memory device manufacturers.

Multiplexers 635a and 635b receive outputs of the scramble logics 630a and 630b, X[15:0] and Y[15:0] and perform multiplexing. In this case, an ASCRAM_EN (address scramble disable) flag and an ASCROFF (real-time address scrambling disable) flag are received and multiplexed.

Operation logics 640a and 640b receives outputs of multiplexers 635a and 635b and performs various operations to generate an Xn[15:0] and an Yn[15:0]. The Xn and the Yn refer to scramble addresses converted to scramble logics.

The Xn and the Yn satisfy equations Xn=NOT(Xi logic El) Yn=NOT(Yi logic Yj), where n, i and j are integers ranging from 0 to 15 and logic is NOP (non operation), AND, OR, XOR operations.

The Xn and the Yn are physical addresses and cannot be input simultaneously. Therefore, the address data A[15:0] is generated by multiplexing. A[15:0] is identical to ADD[15:0] shown in FIG. 3.

An address multiplexing unit 645 comprises multiplexer 645. The address multiplexing unit 645 receives the Xn[15:0], the Yn[15:0] and an AY (Y-address select flag) and performs multiplexing to generate the physical address A[15:0] data.

FIG. 7 is diagram illustrating an example configuration of a data generating unit of the algorithm pattern generator for testing memory device in accordance with the present invention.

Referring to FIG. 7, the data generating unit 370 comprises a logical data generating unit 700a, a scrambled data generating unit 700b, a serialization unit 700c and a de-serialization unit 700d.

Figure 7A:
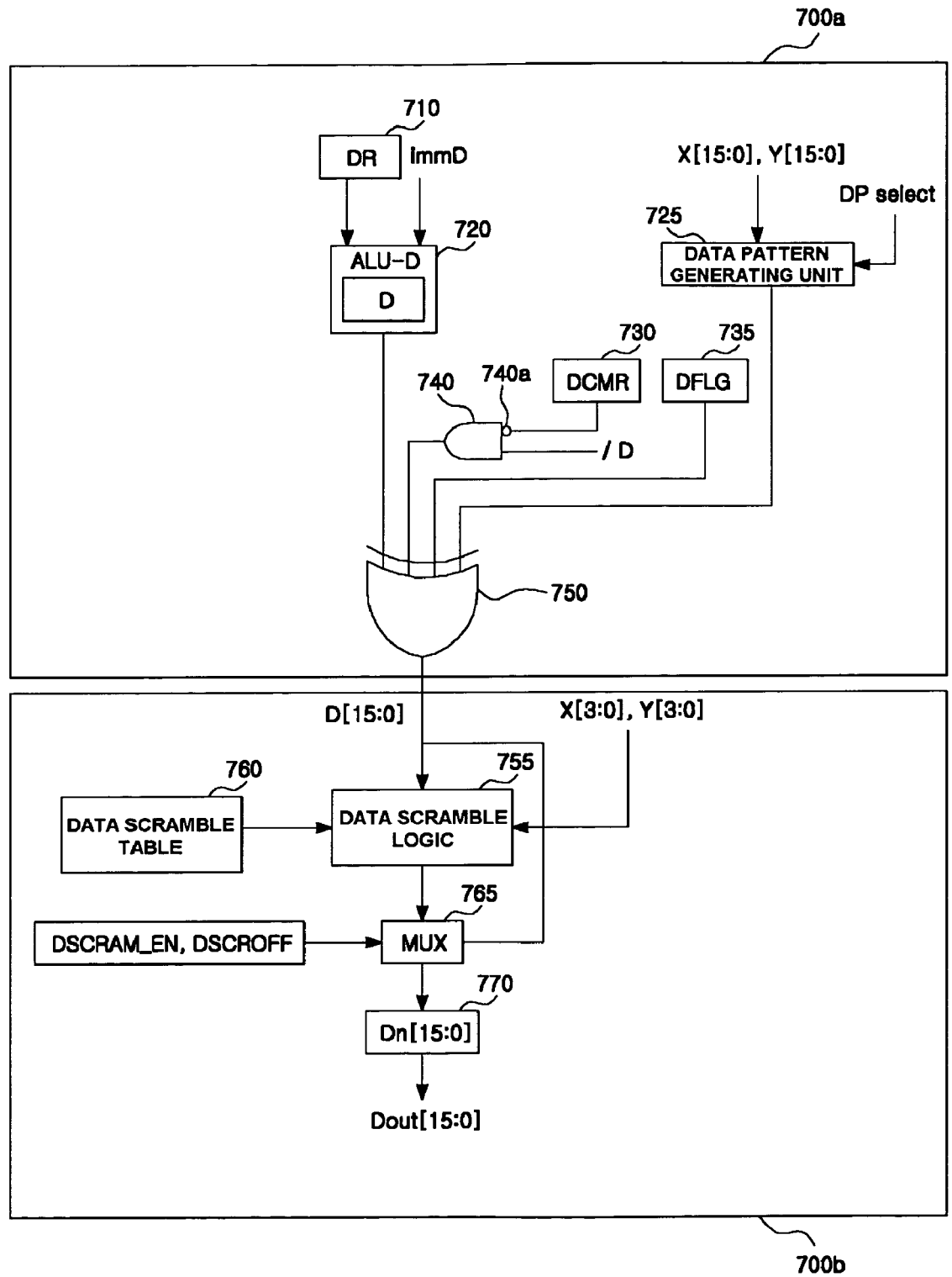
FIGS. 7*a* through 7*c* are diagrams illustrating an example configuration of a data generating unit of the algorithm pattern generator for testing memory device in accordance with the present invention.
Figure 7B:
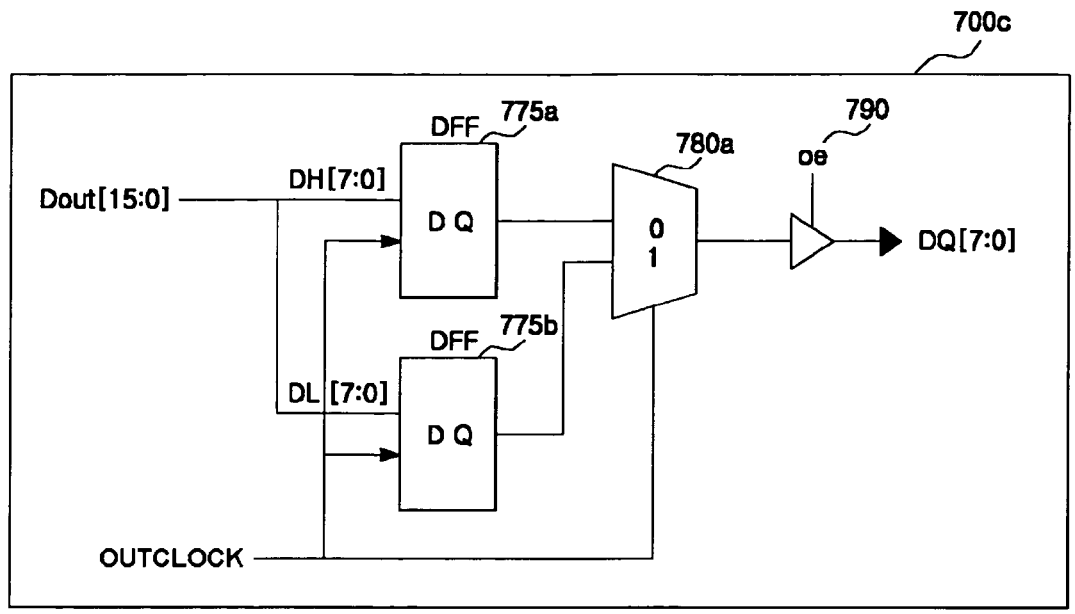
Figure 7C:
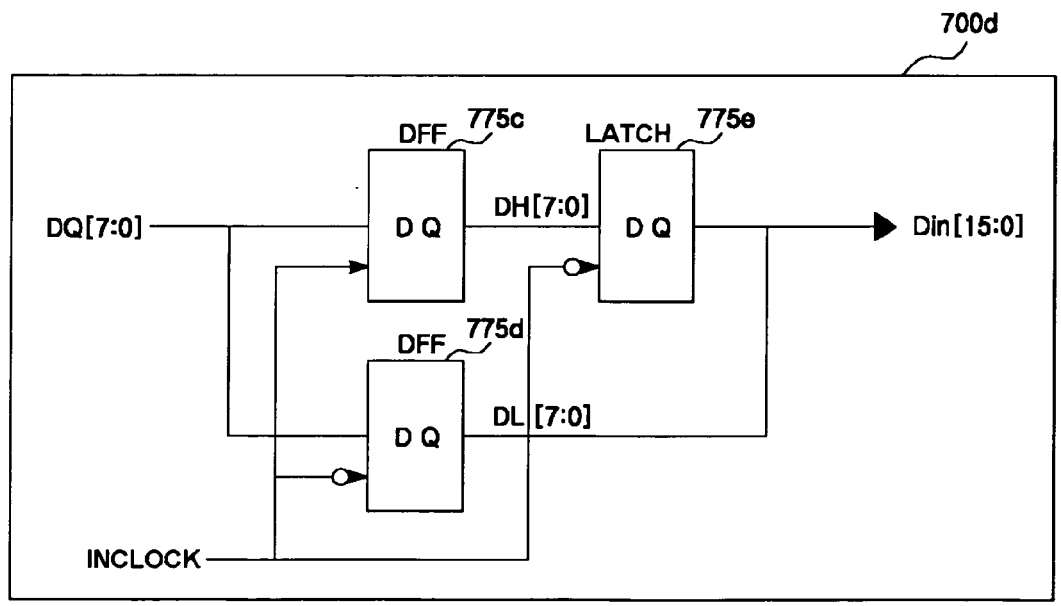

FIG. 7a illustrates an example configuration of the logical data generating unit 700a and the scrambled data generating unit 700b, FIG. 7b illustrates an example configuration of the serialization unit 700c, and FIG. 7c illustrates an example configuration of the de-serialization unit 700d.

A detailed description of the logical data generating unit 700a is as follows.

An initial register ("DR") 710 is a register for storing an initial value of a data.

The ALU-D 720 receives the DR value and immD (immediate value of the data) to perform an arithmetic operation.

The data pattern generating unit 725 receives the signals of the address generating unit 365 X[15:0], Y[15:0] and DP select (data pattern select) signal to generate a data pattern.

The DCMR (Data Complement Mask Register) 730 is a register for storing a mask data for data complement, and for example, configured as a 16 bit register.

The DFLG (consistent data inversion flag) 735 is a register for storing a value for data inversion.

The mask data of the DCMR 730 is inverted through an inverter 740a. The inverted value and /D (real-time data inversion flag) are subjected to an AND operation in an AND logic 740.

Output values of the ALU-D 720, the AND logic 740, the DFLG 735 and an output of the data pattern generating unit 725 are subjected to an exclusive OR operation in exclusive OR logic 750 to generate D[15:0].

A detailed description of the scrambled data generating unit 700b is as follows.

The scrambling of data is represented as a function of an address. Since methods for minimizing an area of a layout differs depending on memory manufacturers, the scrambling of data is a process for conformity.

The D[15:0] is received and a data scrambling is performed in a data scramble logic 755. In this case, the scrambling may be performed based on a scramble data in a data scramble table 760. The data stored in is a unique data for generating data depending on each memory device manufacturers.

A multiplexer 765 receives and performs a multiplexing of an output of the data scramble logic 755, X[3:0] and Y[3:0]. In this case, a DSCRAM_EN (data scramble disable) flag and a DSCROFF (real-time data scrambling disable) flag is received and subjected to the multiplexing. An output value Dn[15:0] is a converted value of the data [15:0] by the data scramble logic 755. Dout[15:0] has the same meaning as the Dn[15:0] and they are symbols only for distinguishing a register and a net.

An operation logic 770 receives an output value of the multiplexer 765 and performs various operations to generate a Dout[15:0]. In the Dout[15:0], it is defined that Dn=NOT (Ai logic Aj), where n is an integer ranging from 0 to 7, A=X or A=Y, I and j are integers ranging from 0 to 3, and the logic is NOP (no operation), AND, OR and XOR logics.

The Dout[15:0] is input as a DQ signal of the memory through serialization. Since the DQ signal of the memory is bi-directional and used for both input and output, a value of Dout is output to a DQ line when writing to the memory and is used as Din through de-serialization from DQ line when reading from the memory. In order to perform these functions, the data generating unit 375 comprises the serialization unit 700c and the de-serialization unit the de-serialization unit 700d for data.

The Dout[15:0] is divided into two portions, namely DH[7:0] and DL[7:0], respectively is input to D-flip-flops 775a and 775b, and is output reflecting a variation of a value according to a rise edge or a fall edge of an outclock. An output of each of the flip-flops 775a and 775b is multiplexed by a multiplexer 780a based on the rise edge or the fall edge of the outclock and then inverted by an inverter 790 to output serialized output signal DQ[7:0].

With respect to the de-serialization, the DQ[7:0] signal is input to each of D-flip-flops 775c and 775d from the memory device and the DH[7:0] and DL[7:0] are generated in the D-flip-flops 775c and 775d by an inclock signal, respectively. The inclock is inverted and then input to the D-flip-flop 775d and a latch 775e. Outputs of latch 775e and the D-flip-flop 775d are summed to output Din[15:0].

Figure 8:
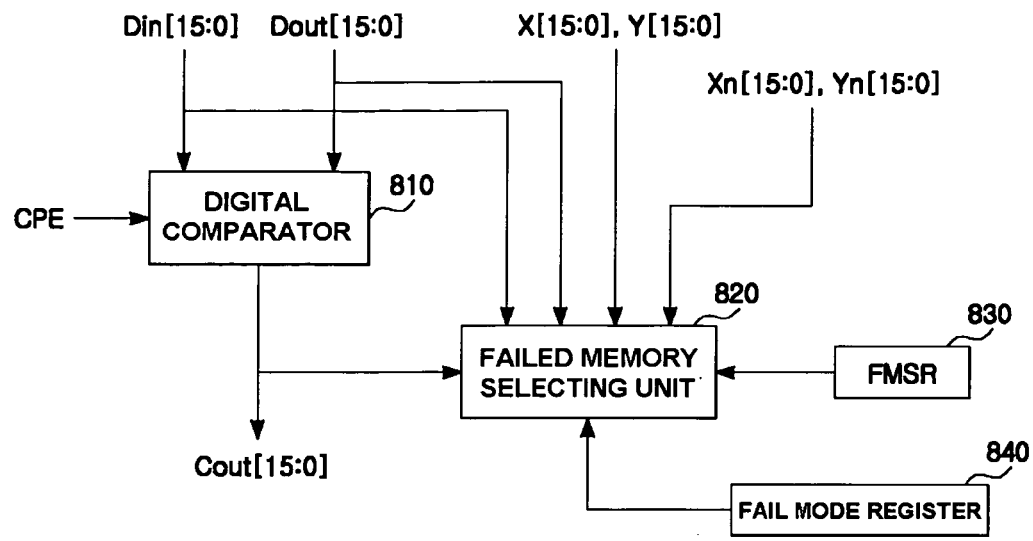
FIG. 8 is diagram illustrating an example configuration of a data comparing unit of the algorithm pattern generator for testing memory device in accordance with the present invention.

FIG. 8 is diagram illustrating an example configuration of a data comparing unit of the algorithm pattern generator for testing memory device in accordance with the present invention.

Referring to FIG. 8, the data comparing unit 375 comprises a digital comparator 810, failed memory selecting unit 820, a FMSR 830 and a fail mode register 840.

The digital comparator 810 receives Din[15:0], which is a signal of the data comparing unit the data comparing unit 375, and Dout(15:0) and performs a data comparison thereof to output Cout[15:0]. In this case, a CPE (compare enable) signal is input to perform the data comparison. That is, the Din which is read from the memory and expected value Dout are compared in the comparator to store corresponding information when a defect occurs.

The failed memory selecting unit 820 receives Din[15:0], Dout[15:0], X[15:0], Y[15:0], Xn[15:0] and Yn[15:0] to select a failed memory. In this case, the failed memory selecting unit 820 may fetch values from the FMSR (Fail Memory Start Register) 830 and the fail mode register 840.

A method for testing memory device using the algorithm pattern generator will now be described in detail with reference to accompanied drawings.

Figure 9:
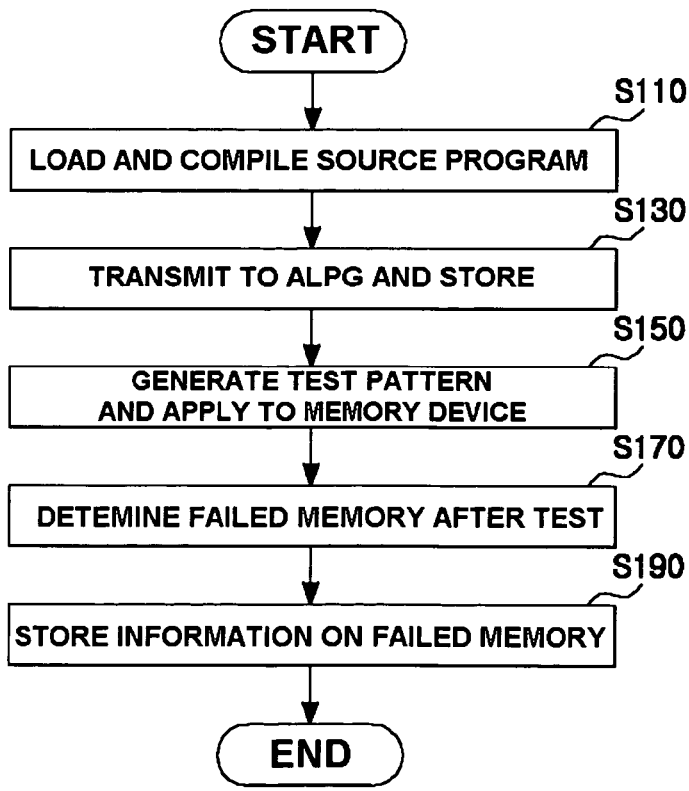
FIG. 9 is a flow chart illustrating a test method using the algorithm pattern generator for testing memory device in accordance with the present invention.

FIG. 9 is a flow chart illustrating a test method using the algorithm pattern generator for testing memory device in accordance with the present invention.

Figure 10A:
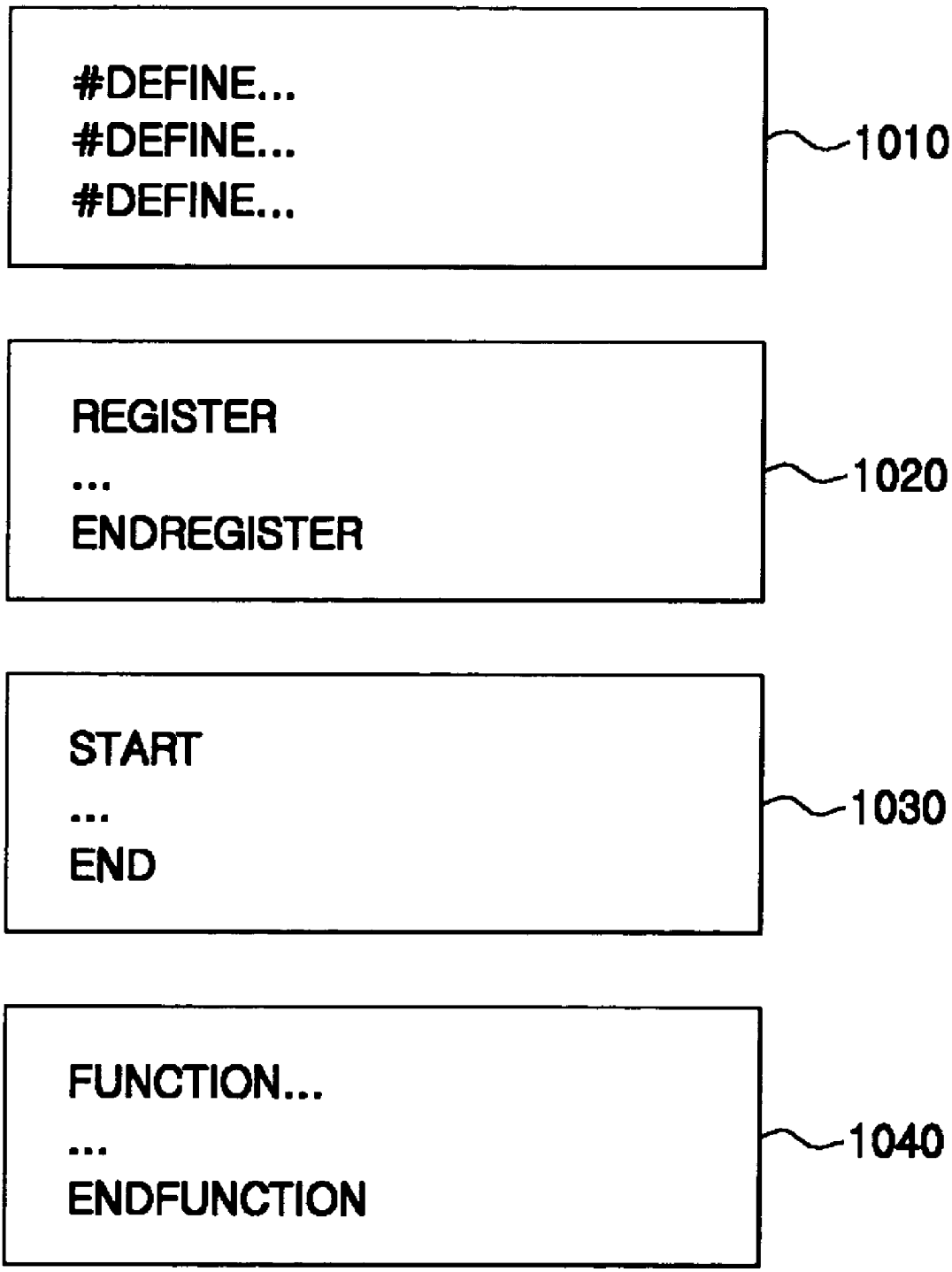
FIG. 10*a* is diagram illustrating a structure of a test program in the test method using the algorithm pattern generator for testing memory device in accordance with the present invention.

Referring to FIG. 9, a source program is loaded. FIG. 10 illustrates an example of the source program, wherein FIG. 10a illustrates a structure of the source program and FIG. 10b illustrate an actual example of the source program.

As shown in FIGS. 9 and 10, the source program is a program describing a memory pattern algorithm and registers. The source program may be divided into a portion 1010 for defining a macro, a register initial block 1020 for defining an initial value of the register, start function block 1030 for describing a test function and a sub-function block 1040 for describing a sub-function.

FIG. 10b illustrates a portion of the actual example of the source program.

The source program written in this manner is loaded by the console PC and compiled by a compiler to generate a test program (S110). The source program and the compiler are described by a TTL (Turbo Test Language) and a TTL compiler developed by the applicant by way of an example. Equivalent programs may be used.

The test program compiled by the compiler is transmitted from the console PC to ALPG in the memory tester in accordance with the present invention to be stored in an internal instruction memory (S130).

The test program is analyzed in the ALPG to generate a test pattern. The test pattern is applied to the memory device to be tested to perform a test (S150). That is, an instruction stored in the test program is fetched and the test pattern including a command logic, an address logic and a data logic necessary for the test is generated and applied to the memory device to be tested to perform the test.

After the test is performed, a data output from the memory device is compared with an expected value generated by ALPG in accordance with the present invention to determine a failed memory device.

When the failed memory device is determined, information on the failed memory is stored.

As described above, the memory tester for carrying out a test at a memory device module level or a component level in accordance with the present invention provides an algorithm pattern generator for testing a memory device having a configuration which can optimize a configuration of a memory tester including an address scrambling and a data scrambling.

While the present invention has been particularly shown and described with reference to the preferred embodiment thereof, it will be understood by those skilled in the art that various changes in form and details may be effected therein without departing from the spirit and scope of the invention as defined by the appended claims.

What is claimed is:

1. An algorithm pattern generator for testing a memory device, comprising:
    an instruction memory for receiving from an external console PC and storing a test program including an instruction for performing a test;
    a sequence control unit for sequentially fetching the instruction included in the test program from the instruction memory when performing the test;
    an interface unit for interfacing to an external device;
    a phase lock loop (PLL) for providing a clock signal having an identical phase;
    a command generating unit for generating a command necessary for the test with respect to each of cycles provided by the PLL;
    an address generating unit for generating a logical address with respect to each of the cycles and converting the logical address to a physical address necessary for the test via an address scrambling;
    data generating unit for generating a logical data based on the logical address with respect to each of the cycles and converting the logical data to a physical data necessary for the test via a data scrambling; and
    a data comparing unit for comparing a data generated in the data generating unit and a test data for each of the cycles and storing an information on a failed memory.

2. The algorithm pattern generator for testing a memory device in accordance with claim 1, wherein the interface unit performs an interfacing with a variable power supply for providing a voltage for the test, the console PC for generating the test program and receiving and analyzing a test result, a clock generating unit for generating a reference clock, and a memory tester including a controlling unit for controlling.

3. The algorithm pattern generator for testing a memory device in accordance with claim 1, wherein the instruction memory stores at least one instruction, the instruction comprising a sequence field which is a data used for controlling a sequence of the test program by calculating an instruction pointer for each clock cycle, an address field which is a data for an arithmetical operation for generating a memory data line, and a control field which is a data for a memory control signal state or a real time inversion flag.

4. The algorithm pattern generator for testing a memory device in accordance with claim 1, wherein the sequence control unit comprises:
    an instruction pointer for loading and storing a pointer of the instruction from the instruction memory;
    a stack register for stack of the instruction pointer;
    a plurality of instruction counter registers for an instruction counter;
    a flag register for storing a flag data; and
    a control unit for loading and controlling a corresponding operation from the instruction memory and controlling the instruction pointer, stack register or the plurality of instruction counter registers.

5. The algorithm pattern generator for testing a memory device in accordance with claim 1, wherein the command generating unit generates the command including CS (chip select), RAS (Row Address Strobe) and CAS (Column Address Strobe) signals.

6. The algorithm pattern generator for testing a memory device in accordance with claim 1, wherein the address generating unit comprises:
    a logical address generating unit for generating the logical address, wherein the logical address includes a row address, a column address and a bank address of a memory;
    a scrambled address generating unit for generating a scrambled address of the row address and the column address of the memory; and
    an address multiplexer for generating the physical address by multiplexing the scrambled address.

7. The algorithm pattern generator for testing a memory device in accordance with claim 6, wherein the logical address generating unit comprises:
    a first initial value register for storing an initial value of the row address X of the memory;
    a second initial value register for storing an initial value of the column address Y of the memory;
    a third initial value register for storing an initial value of the bank address Z of the memory;
    an ALU-DX for generating an additional row address DX by receiving a value of the first initial value register and performing the arithmetical operation;
    an ALU-DY for generating an additional column address DY by receiving a value of the second initial value register and performing the arithmetical operation;
    an ALU-X for performing the arithmetical operation for generating the column address by receiving an output value of the ALU-DX and an immediate address value immX of the row address;
    an ALU-Y for performing the arithmetical operation for generating the column address by receiving an output value of the ALU-DY and an immediate address value immY of the column address;
    an ALU-Z for performing the arithmetical operation for generating the bank address by receiving a value of the third initial value register;
    a first inverter for outputting the row address of the memory by inverting an output value of the ALU-X when a row address inversion flag is input;
    a second inverter for outputting the column address of the memory by inverting an output value of the ALU-Y when a column address inversion flag is input; and
    a third inverter for outputting the bank address of the memory by inverting an output value of the ALU-Z when a bank address inversion flag is input.

8. The algorithm pattern generator for testing a memory device in accordance with claim 6, wherein the scrambled address generating unit comprises:
    an X-scramble table for storing a data which is a reference for a row address scrambling;
    an Y-scramble table for storing a data which is a reference for a column address scrambling;
    an X-scrambling logic for performing an address scrambling based on values stored in the X-scramble table by receiving the row address X of the memory which is an output of the logical address generating unit;

an Y-scrambling logic for performing an address scrambling based on values stored in the Y-scramble table by receiving the column address Y of the memory which is an output of the logical address generating unit;

a first multiplexer for receiving and multiplexing an output value of the X-scrambling logic and the row address X of the memory which is the output of the logical address generating unit;

a first multiplexer for receiving and multiplexing an output value of the X-scrambling logic and the row address X of the memory which is the output of the logical address generating unit;

a second multiplexer for receiving and multiplexing an output value of the Y-scrambling logic and the column address Y of the memory which is the output of the logical address generating unit;

an X-operation logic for generating an scrambled row address by receiving an output of the first multiplexer and an ASCRAM_EN (address scramble disable) flag or an ASCROFF (real-time address scrambling disable) flag which is a flag associated with a scrambling to convert to a physical address; and an Y-operation logic for generating an scrambled column address by receiving an output of the second multiplexer and the ASCRAM_EN flag or the ASCROFF flag to convert to a physical address, wherein the X-scrambling logic generates an output value defined by Xn=NOT(Xi logic Xj) [where n, i and j are integers ranging from 0 to 15 and logic is NOP (non operation), AND, OR, XOR operation], and wherein and the Y-scrambling logic generates an output value defined by Yn=NOT(Yi logic Yj) [where n, i and i are integers ranging from 0 to 15 and logic is NOP (non operation), AND, OR, XOR operation)].

9. The algorithm pattern generator for testing a memory device in accordance with claim 6, wherein the address multiplexer comprises a third multiplexer for generating a physical address by multiplexing an output value of the scrambled address generating unit using an AY (Y-address Select) flag.

10. The algorithm pattern generator for testing a memory device in accordance with claim 1, wherein the data generating unit comprises:

a logical data generating unit for generating the logical data based on the logical address;

a scrambled data generating unit for generating a scrambled data obtained by scrambling the logical data being outputted from the logical data generating unit;

a serialization unit for serializing the scrambled data so as to input as a DQ signal of the memory; and a de-serialization unit for de-serializing a data output from the DQ signal of the memory.

11. The algorithm pattern generator for testing a memory device in accordance with claim 10, wherein the logical data generating unit comprises:

an initial register for storing an initial value of a data;

a data pattern generating unit for generating a data pattern by receiving a DP (Data Pattern) select signal and the row address X and the column address Y of the memory which are an internal signal value of the address generating unit;

a data complement mask register for storing a mask data for data complement;

a DFLG register for storing DFLG (consistent data inversion flag) which is for inverting data;

a fourth inverter for inverting the mask data of the data complement mask register;

an AND logic for receiving an output signal of the fourth inverter and a real time inversion flag to perform an AND logic operation; and an XOR logic for performing an XOR logic operation of an output value of the ALU-D, an output value of the AND logic, a value stored in the DFLG register and an output value of the pattern generating unit to generate the logical data.

12. The algorithm pattern generator for testing a memory device in accordance with claim 10, wherein the scrambled data generating unit comprises:

a data-scramble table for storing a data which is a reference for scrambling;

a data scramble logic for receiving a logical data which is an output signal of the logical data generating unit and a portion of the logical address value of the address generating unit and performing a data scrambling based on a value stored in the data-scramble table;

a fourth multiplexer for receiving and multiplexing an output value of the data scramble logic and a DSCRAM_EN (data scramble disable) flag or DSCROFF (real-time data scrambling disable) flag which is a flag associated with a scrambling to convert to a physical address; and a data operation logic for generating a scrambled data by receiving an output value of the fourth multiplexer, wherein the data operation logic generates an output value defined by Dn=NOT(Ai logic Aj) [where A=X or A=Y, i and j are integers ranging from 0 to 3, and logic is NOP (non operation), AND, OR, XOR logic].

13. The algorithm pattern generator for testing a memory device in accordance with claim 10, wherein the serialization unit comprises:

a first flip-flop for outputting a received MSB (Most Significant Bit) portion of an output data of the scrambled data generating unit by reflecting a variation in a value based on an out-clock;

a second flip-flop for outputting a received LSB (Least Significant Bit) portion of an output data of the scrambled data generating unit by reflecting a variation in a value based on an out-clock;

a fifth multiplexer for receiving and multiplexing outputs of the first and the first flip-flop based on the out clock; and a fifth inverter for generating a serialized output signal by inverting a signal multiplexed by the fifth multiplexer.

14. The algorithm pattern generator for testing a memory device in accordance with claim 1, wherein the de-serialization unit comprises:

a third flip-flop for outputting the received DQ signal of the memory by reflecting a variation in a value based on an in-clock;

a fourth flip-flop for outputting a received output signal of the serialization unit by reflecting a variation in a value based on an inverted value of the in-clock;

a latch for outputting a received output signal of the third flip-flop by reflecting a variation in a value based on an inverted value of the in-clock; and an output unit for outputting a signal by combining output signals of the latch and the fourth flip-flop.

15. The algorithm pattern generator for testing a memory device in accordance with claim 1, wherein the data comparing unit comprises:

a digital comparing unit for receiving an output signal of the data generating unit to perform a data comparison;

a failed memory selecting unit for selecting a failed memory; and a storing means for storing information on a start register of the failed memory and a fail mode.

16. The algorithm pattern generator for testing a memory device in accordance with one of claims 1 through 15, wherein the algorithm pattern generator is embodied as a single chip using FPGA.

17. A computer-readable recording medium having embodied thereon a program performing the functions of:

receiving from an external console PC and storing a test program including an instruction for performing a test;

sequentially fetching the instruction of the test program from an instruction memory when performing the test;

performing an interfacing with an external device;

generating and providing a clock signal having an identical phase;

generating a logical address with respect to an individual clock cycle of the clock signal;

converting the logical address to a physical address necessary for the test via an address scrambling;

generating a logical data based on the logical address with respect to the individual clock cycle and converting the logical data to a physical data necessary for the test via a data scrambling; and comparing a data generated by the data generating unit with a test data in accordance with the individual clock cycle and storing information on a failed memory.

* * * * *